United States Patent [19]
Kikuchi et al.

[11] Patent Number: 5,919,336
[45] Date of Patent: Jul. 6, 1999

[54] APPARATUS FOR FABRICATING SEMICONDUCTOR DEVICE AND METHOD FOR FABRICATING SEMICONDUCTOR DEVICE

[75] Inventors: Jun Kikuchi; Shuzo Fujimura; Masao Iga, all of Kawasaki, Japan

[73] Assignee: Fujitsu Limited, Kawasaki, Japan

[21] Appl. No.: 08/971,569

[22] Filed: Nov. 17, 1997

Related U.S. Application Data

[63] Continuation of application No. 08/560,509, Nov. 17, 1995, abandoned, which is a continuation of application No. 08/186,633, Jan. 26, 1994, abandoned.

[30] Foreign Application Priority Data

Mar. 31, 1993 [JP] Japan .................................... 5-074076
Jun. 23, 1993 [JP] Japan .................................... 5-152381

[51] Int. Cl.⁶ ...................................................... B65C 3/26
[52] U.S. Cl. ......................... 156/723; 438/723; 438/727; 134/1.1; 134/1.2; 134/1.3
[58] Field of Search .................................. 438/723, 727; 134/1.1, 1.2, 1.3

[56] References Cited

U.S. PATENT DOCUMENTS

| | | | |
|---|---|---|---|
| 4,462,863 | 7/1984 | Nishimatsu | 156/643 |
| 4,615,756 | 10/1986 | Tsujii et al. | 156/345 |
| 4,664,747 | 5/1987 | Sekiguchi et al. | 156/643 |
| 4,863,561 | 9/1989 | Freeman et al. | 156/646 |
| 4,983,254 | 1/1991 | Fujimura et al. | 156/643 |
| 4,992,134 | 2/1991 | Gupta et al. | 156/643.1 |
| 5,002,632 | 3/1991 | Loewenstein et al. | 156/643 |
| 5,007,983 | 4/1991 | Lerner et al. | 156/643 |
| 5,030,319 | 7/1991 | Nishino et al. | 156/643 X |
| 5,089,441 | 2/1992 | Moslehi | 437/225 |
| 5,092,937 | 3/1992 | Ogura et al. | 134/30 |
| 5,223,085 | 6/1993 | Kawai et al. | 156/646 |
| 5,225,036 | 7/1993 | Watanabe et al. | 156/643 |
| 5,298,112 | 3/1994 | Hayasaka et al. | 156/643 |
| 5,308,791 | 5/1994 | Horiike et al. | 156/643 X |
| 5,326,406 | 7/1994 | Kaneko et al. | 134/1 |
| 5,328,558 | 7/1994 | Kawamura | 156/643 |

FOREIGN PATENT DOCUMENTS

| | | |
|---|---|---|
| 0 246 802 | 11/1987 | European Pat. Off. . |
| 0 376 252 | 7/1990 | European Pat. Off. . |
| 0 406 434 | 1/1991 | European Pat. Off. . |
| 0517165 | 12/1992 | European Pat. Off. . |
| 64-14218 | 1/1964 | Japan . |
| 64-41218 | 2/1989 | Japan . |
| 64-59819 | 3/1989 | Japan . |
| 1-219184 | 9/1989 | Japan . |
| 1-259184 | 10/1989 | Japan . |
| 2-77124 | 3/1990 | Japan . |

OTHER PUBLICATIONS

B. Anthony, et al., "In situ Cleaning of Silicon Substrate . . . ", 8257b Journal of Vacuum Science & Technology B 7(1989), No. 4, pp. 621–626.

T. Aoyama, et al., "Removing Native Oxide . . . ", 320 Applied Physics Letters, 59 (1991), pp. 2576–2578.

"Ideal Hydrogen Termination of the Si (111) Surface," G.S. Higashi et al., J. Appl. Phys. Lett., vol. 56, No. 7, Feb. 1990, pp. 656–658.

"In–Situ RHEED Monitoring of Hydrogen Plasma Cleaning on Semiconductor Surfaces," A. Kishimoto et al., J. Appl. Phys. Lett., vol. 29, No. 10, Oct. 1990, pp. 2273–2276.

"Control of the Chemical Reactivity of a Silicon Single--Crystal Surface Using the Chemical Modification Technique," T. Takahagi et al., J. Appl. Phys. Lett., vol. 68, No. 5, Sep. 1, 1990, pp. 2187–2191.

*Primary Examiner*—Thi Dang
*Attorney, Agent, or Firm*—Staas & Halsey

[57] ABSTRACT

A method for treating the surface of a semiconductor layer includes the step of removing an oxide from the surface of a semiconductor layer by adding fluorine or fluoride to hydrogen radicals separately from plasma atmosphere and thereafter exposing the semiconductor layer to the mixed gas and hydrogen-terminating the surface.

13 Claims, 9 Drawing Sheets

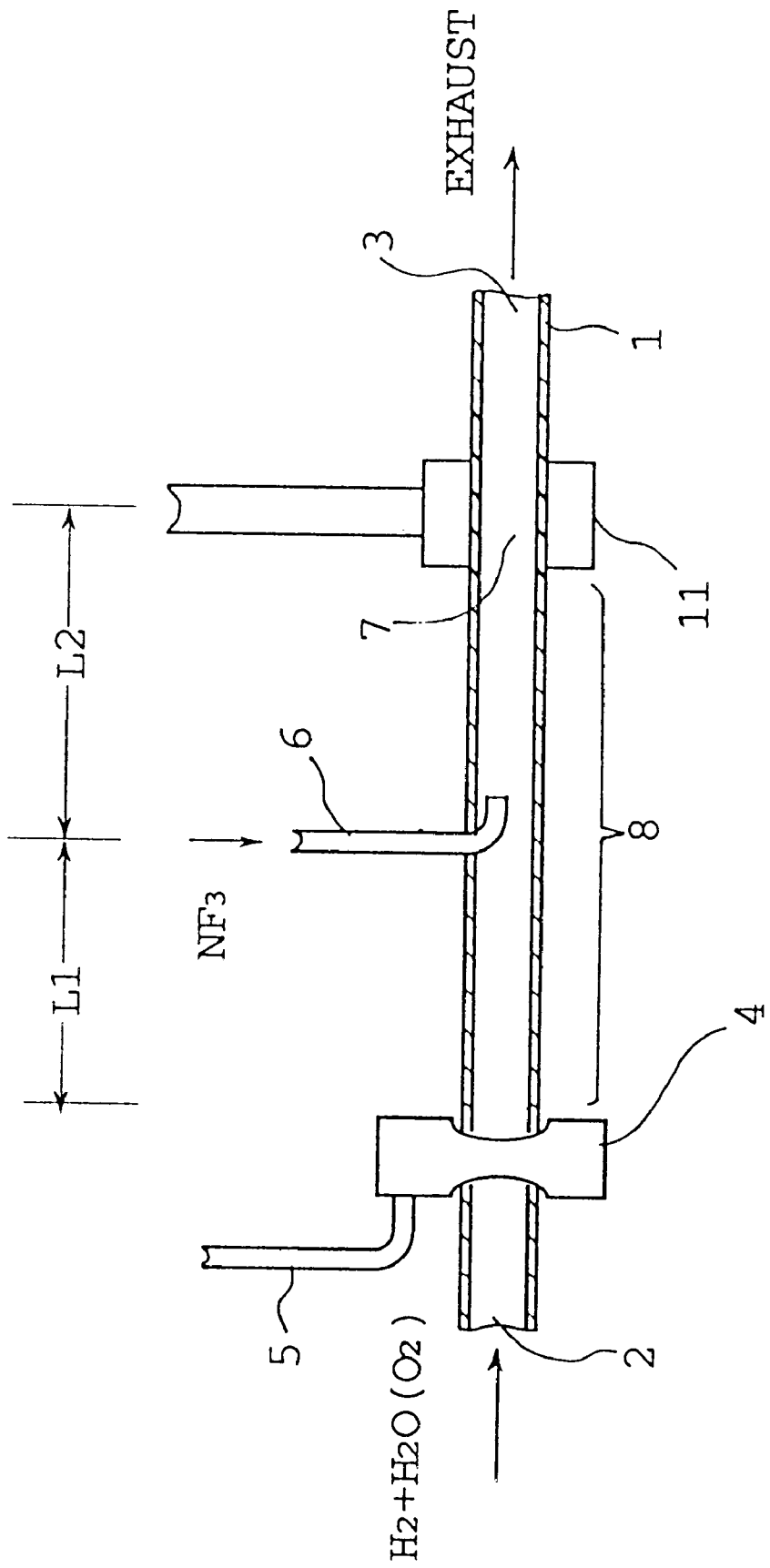

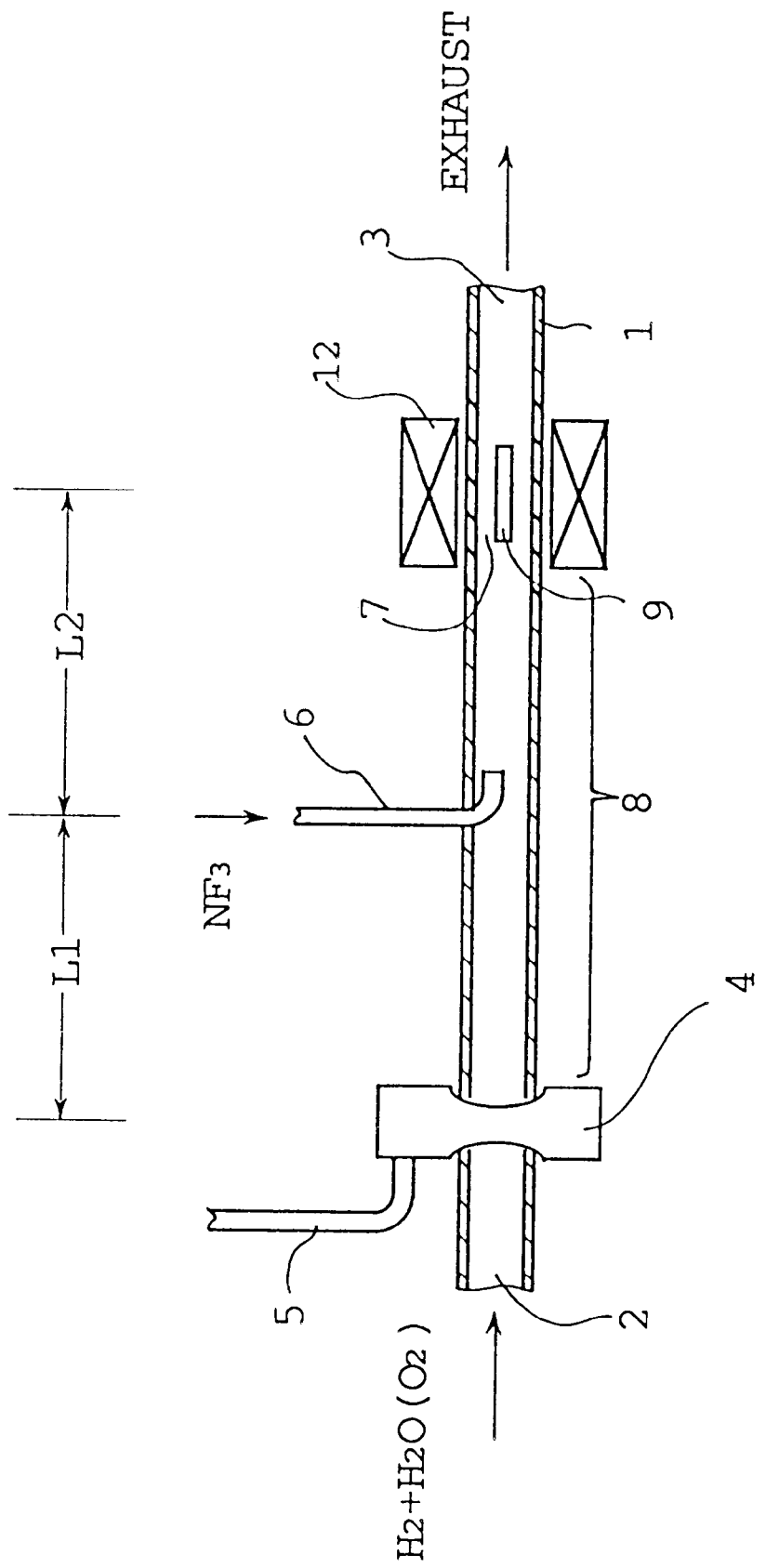

DEIONIZES WATER

APPARATUS FOR FABRICATING SEMICONDUCTOR DEVICE AND METHOD FOR FABRICATING SEMICONDUCTOR DEVICE

This application is a continuation of application number 08/560,509, filed Nov. 17, 1995, now abandoned, which is a continuation of application number 08/186,633, filed Jan. 26, 1994, now abandoned.

BACKGROUND OF THE INVENTION

1. Field of the Invention

The present invention relates to an apparatus for fabricating semiconductor device including a step of treating the surface of a semiconductor layer with hydrogen, and a method for fabricating semiconductor device including a step of treating the surface of the semiconductor layer with hydrogen. Particularly, the present invention relates to a method and an apparatus for removing a natural oxide layer from the surface of a silicon layer and moreover terminating the surface of the silicon layer using hydrogen, and a method for fabricating a semiconductor device including the above steps.

2. Description of the Related Art

The following are known as the existing methods for removing a natural oxide layer from the surface of a semiconductor wafer and hydrogen-terminating the surface of the semiconductor wafer: the wet treatment using diluted hydrofluoric acid described in the following document [1], the dry treatment using hydrogen plasma described in the following document [2], and the dry treatment using hydrogen atoms (hydrogen radicals) described in the following document [3].

[1] G. S. Higashi et al., J. Appl. Phys. Lett., Vol.56, No.7, 1990, pp.656–658

[2] A. Kishimoto et al., Jpn. J. Appl. Phys., Vol. 29, No.10, 1990, pp.2273–2276

[3] T. Takahagi et al., J. Appl. Phys., Vol.68, No.5, 1990, pp.2187–2191

Among the above methods, the wet treatment using diluted hydrofluoric acid makes it possible to obtain a stable surface hardly reacting on other elements for a (111) plane of silicon. However, there is no stability for a (100) plane of silicon. Moreover, because of the wet treatment, fluorine may be left on the surface of a semiconductor wafer. Furthermore, it is difficult to connect a wet treatment apparatus with a dry treatment apparatus. Therefore, the dry treatment is desirable because it allows the apparatuses to easily connect each other.

The dry treatment using hydrogen plasma may damage the surface of a silicon substrate because high-energy particles collide with the surface.

The dry treatment using hydrogen radicals does not have the above problems. However, it is described in the above document[3] that the treatment took a long time at the hour order. Therefore, this dry treatment cannot practically be used.

As another type of dry treatment, a method for removing a natural oxide layer by transforming hydrogen fluoride ($NF_3$) and hydrogen ($H_2$) into plasma is disclosed in the official gazette of Japanese Unexamined Publication (KOKAI) No. Hei. 2-77124. The inventors of the present invention. confirmed that a natural oxide layer was removed by this method. However, at the same time, the fact was found that the inner surface of a silica tube constituting a reaction chamber was etched and roughened.

It is an object of the present invention to provide a method and an apparatus for treating the surface of a semiconductor layer to shorten the time consumed for oxide layer removal and hydrogen termination by means of dry treatment, and moreover prevent the inner surface of a silica tube serving as a reaction chamber from roughening, and a method for fabricating a semiconductor device including the above steps.

SUMMARY OF THE INVENTION

The present invention provides an apparatus for treating the surface of a semiconductor layer having a region for introducing at least nitrogen fluoride ($NF_3$) at the downstream side of a gas flown from a hydrogen plasma region and having a semiconductor layer setting region at further downstream side of it. In this case, oxygen or water vapor is also introduced into the region for transforming hydrogen into plasma.

Another invention of this application provides a method for treating the surface of a semiconductor layer including the steps of adding nitrogen fluoride to activated hydrogen outside of plasma atmosphere, and thereafter removing an oxide from the surface of the semiconductor layer and hydrogen-terminating the surface.

Still another invention of this application provides a method for treating the surface of a semiconductor layer by transforming a hydrogen-contained gas such as hydrogen and water vapor ($H_2+H_2O$) or hydrogen and oxygen ($H_2+O_2$) into plasma and adding at least $NF_3$ to the thus-obtained activated gas.

For these inventions, a region for introducing $NF_3$ is outside a region where high energy particles, such as, ions and electrons are present, and at least $NF_3$ is added to hydrogen atoms generated in the plasma region, and these gases are supplied to an oxide on the surface of a semiconductor layer to remove the oxide from the surface, and moreover the surface of the semiconductor layer is hydrogen-terminated. It was confirmed through experiments that the time required for the oxide layer removal and hydrogen termination was shortened compared with the prior art using only hydrogen radicals or only hydrogen plasma down-flow. Water vapor or oxygen supplied to the plasma region together with hydrogen had a function for preventing hydrogen radicals from decreasing.

Moreover, it was confirmed through an experiment that the semiconductor layer and the inner wall of the silica etching chamber were not damaged by adding at least $NF_3$ to the hydrogen radicals presenting at the downstream side of a gas flown from the plasma region to remove the natural oxide layer from the semiconductor layer surface and hydrogen-terminating the surface.

In this case, fluorine atoms were not contained in the reaction gas.

As the result of removing the natural oxide layer from the semiconductor layer surface in the above manner, a reaction product may be present on the surface. Though the products naturally disappears by leaving the products as it is for a predetermined time, they are easily removed by heating the semiconductor layer surface or cleaning it by water.

BRIEF DESCRIPTION OF THE DRAWINGS

FIG. 4 is a sectional view of a semiconductor layer surface treatment apparatus showing the state of an experiment for changing the concentration of hydrogen present in a substrate setting region.

FIG. 6 is a sectional view of the semiconductor layer surface treatment apparatus of another embodiment of the present invention.

DESCRIPTION OF THE PREFERRED EMBODIMENTS

Embodiments of the present invention are described below by referring to accompanying drawings.

Figure 1:
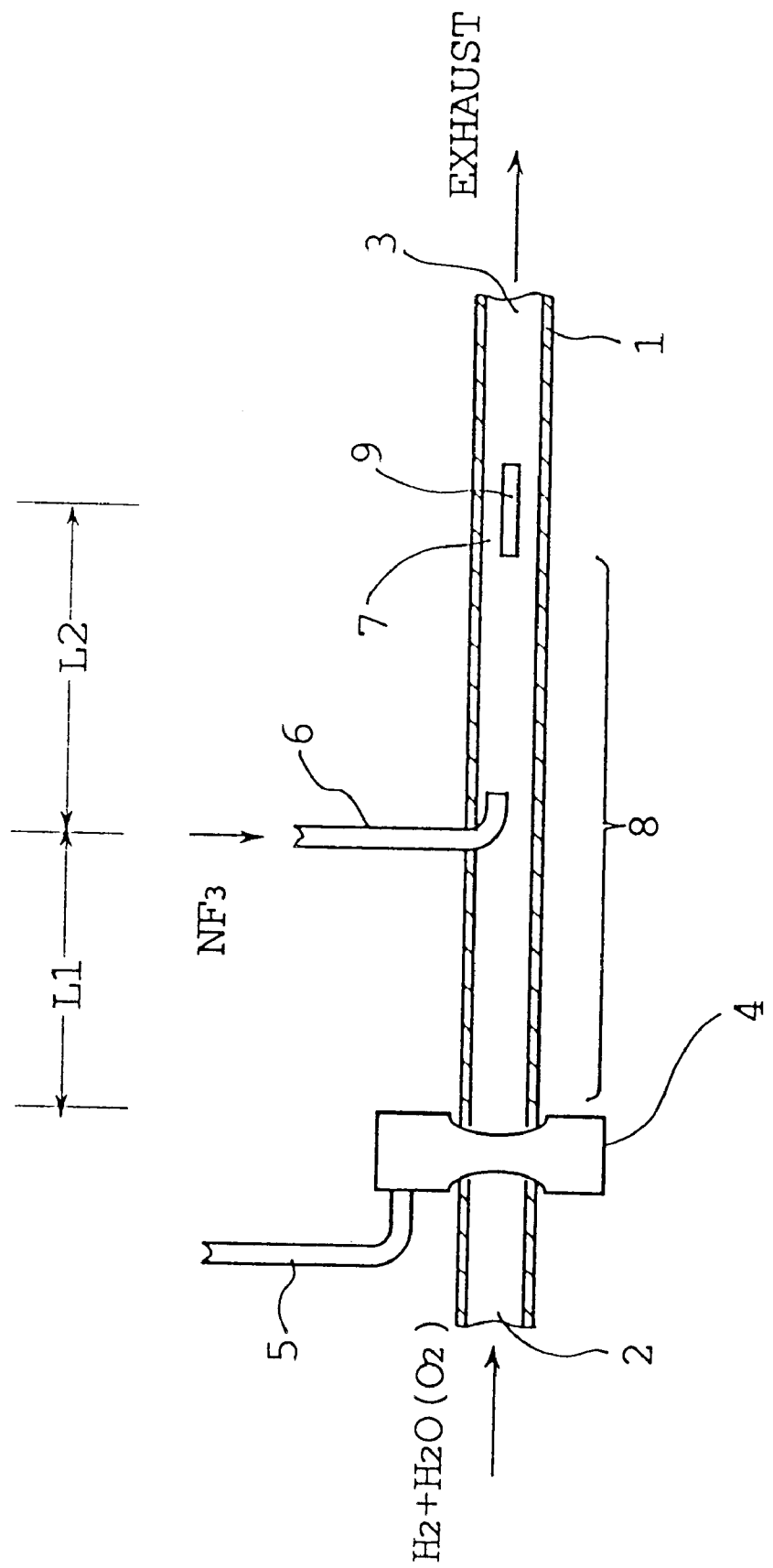
FIG. 1 is a sectional view of the semiconductor layer surface treatment apparatus of an embodiment of the present invention.

(1) Natural oxide layer removing apparatus of embodiment of the present invention FIG. 1 is a sectional view for explaining the constitution of the hydrogen plasma down-flow treatment apparatus of an embodiment of the present invention. This apparatus is used to fabricate a semiconductor device.

In FIG. 1, symbol 1 represents a chamber comprising a cylindrical slender silica tube with an inside diameter of approx. 9 mm and 2 represents a first gas introduction port for introducing a hydrogen-contained gas such as a mixed gas of hydrogen and water vapor. Water vapor is added so as to prevent hydrogen radicals (H*) transformed into plasma gas from recombining and returning to hydrogen molecules ($H_2$) while the hydrogen radicals are moving to a wafer setting part 7 in the chamber 1. Symbol 3 represents an exhaust port for exhausting the gas in the chamber 1 to reduce the pressure and discharging unnecessary gas, to whose end a not-illustrated exhauster or other apparatus is connected.

Symbol 4 represents a plasma generating part provided closely to the first gas introduction port 2 for transforming the mixed gas of hydrogen and water vapor into plasma, which transforms the mixed gas of hydrogen and water vapor into plasma by microwaves with the frequency of 2.45 GHz led by a waveguide 5.

Symbol 6 represents a second gas introduction port (gas introducing part) for introducing nitrogen fluoride ($NF_3$) gas or $NF_3$-contained gas into the chamber 1, which is present outside a region in which plasma gas expanded from the plasma generating part 4 and, in the case of this embodiment, provided at the downstream side of the flow of a gas approx. 200 mm ($L_1$) separate from the plasma region generated in the plasma generating part 4. Thereby, $NF_3$ gas is added to an active gas containing hydrogen radicals flown from the upstream side.

Symbol 7 represents a wafer setting part for removing a natural oxide layer from the surface of a semiconductor layer and hydrogen-terminating the surface, on which a silicon substrate 9 with a natural oxide layer 10 formed on it is set. The wafer setting part 7 is formed at the downstream side of a gas channel approx. 800 mm ($L_2$) separate from the second gas introduction port 6. The range (a reactive gas flowing region 8) from the second gas introduction port 6 to the wafer setting part 7 requires a distance allowing hydrogen radicals to adequately react on $NF_3$ gas and capable of keeping the state.

As described above, the apparatus of this embodiment easily connects with many other fabrication apparatuses including a CVD apparatus and a sputtering apparatus because it performs dry treatment and makes it possible to easily automate a series of the steps of fabricating a semiconductor device.

It is possible to introduce a molecular gas containing oxygen atom or a oxygen gas instead of water vapor to be supplied to the plasma generating part 4. It is also possible to mix any one of them at least.

The chamber 1 can use not only a silica tube but a tubular structure made of a material containing silicon oxide. Moreover, the chamber may have a shape like a dome, bell-jar, or barrel. The material of the chamber can use metal instead of silica. Even if a part (e.g. window) made of silica comprising the chamber, the surface of the part is not roughened as described above.

Figure 2A:
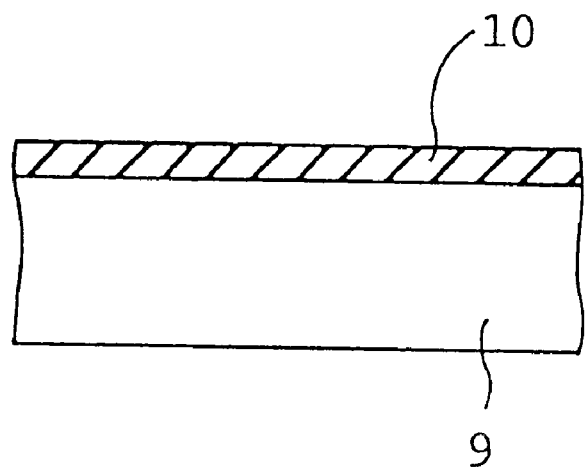
FIGS. 2A and 2B are sectional views showing a change of the surface of a silicon substrate treated by the apparatus shown in FIG. 1.
Figure 2B:
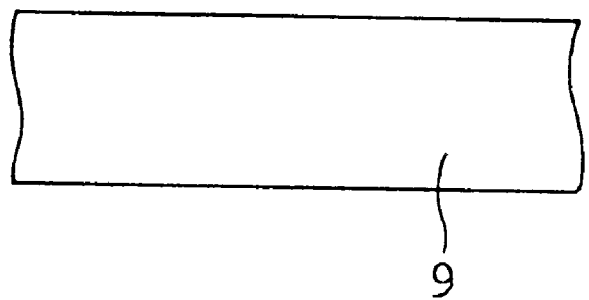

(2) Natural oxide layer removing and hydrogen termination method of embodiment of the present invention (i) Natural oxide layer removal and hydrogen termination FIGS. 2A and 2B are sectional views for explaining the method of an embodiment of the present invention for removing a natural oxide layer from the surface of a silicon substrate 9 by means of hydrogen treatment and moreover hydrogen-terminating the surface.

FIG. 2A shows the silicon substrate 9 on which a natural oxide layer 10 with the thickness of 13 Å. In this case, the plane orientation of the silicon substrate 9 appears a (111) plane and the substrate temperature is set to the room temperature.

First, the silicon substrate 9 under the above state is set to a wafer setting part 7 shown in FIG. 1. Thereafter, hydrogen gas at the flow rate of 80 cc/min is introduced into a chamber 1 through a first gas introduction port 2 while exhausting the gas in the chamber 1 through an exhaust port 3.

Then, microwaves with the frequency of 2.45 GHz and a wattage of approx. 20 W is led to a plasma generating part 4 from a waveguide 5. Thereby, in the plasma generating part 4 hydrogen ions, electrons and hydrogen radicals are generated. In this case, the gas under plasma state is locally present in the vicinity of the plasma generating part 4. And, an active gas containing a lot of hydrogen radicals move along the flow of a gas to the downstream side.

Then, $NF_3$ gas is introduced into the chamber 1 at the flow rate of 90 cc/min through a second gas introduction port 6 at the downstream side of the gas flown from a plasma region to add it to the active gas.

Thereafter, water vapor ($H_2O$) is supplied at the flow rate of 20 cc/min through the first gas introduction port 2 to add the water vapor to hydrogen plasma. In this case, the pressure in the chamber 1 is adjusted to approx. 3 Torr.

Unless $H_2O$ is added, the content of hydrogen molecules generated due to re-combination of hydrogen ions and hydrogen radicals may almost absolutely increase in the active gas. For this embodiment, it is confirmed that re-combination of hydrogen ions and radicals is suppressed due to presence of water vapor and hydrogen radicals are considerably prevented from decreasing.

Moreover, it is considered that any reaction occurs between the hydrogen radicals and $NF_3$ gas until they reach the wafer setting part 7. When this state is kept for 15 min, the natural oxide layer 10 is completely removed from the surface of the silicon substrate 9 and hydrogen combines with silicon atoms on the surface of the silicon substrate 9 to make hydrogen termination.

Presence or absence of the natural oxide layer 10 is judged by whether the surface of the silicon substrate 9 remains hydrophilic or it is changed to be hydrophobic. When the surface remains hydrophilic, the natural oxide layer 10 is left. However, when the surface is changed to be hydrophobic, the natural oxide layer 10 is removed and also hydrogen termination is performed.

Then, after supply of water vapor and $NF_3$ into the chamber 1 is stopped in order, application of microwaves is stopped to and thereafter introduction of hydrogen gas is stopped. Then, to start the next step, the silicon substrate 9 is taken out or transferred to a connected treatment apparatus.

As described above, the semiconductor device fabrication method of an embodiment of the present invention adds $NF_3$ gas to hydrogen radicals and water vapor to remove the natural oxide layer 10 by the reaction with a mixed gas of them. Therefore, it is confirmed that the treatment time for removing the natural oxide layer 10 from the surface of the silicon substrate 9 is shortened from the hour order to the minute order of 15 min or less.

Moreover, $NF_3$-contained gas is added to the hydrogen radicals at the downstream side of the gas channel of the gas flown from the plasma generating part 4 and also at further downstream side than the region in which a gas under plasma state is present, and the natural oxide layer 10 is removed by exposing it to a mixed gas of them. Therefore, the chemical reaction between hydrogen radicals, $NF_3$ and natural oxide layer becomes predominant and, differently from the prior art method, high-energy particles are not contained in the reaction gas for removing the natural oxide layer 10 and the silicon substrate 9 is not damaged.

Moreover, fluorine is prevented from remaining on the silicon substrate 9 differently from wet treatment, and the surface of the silicon substrate 9 becomes chemically stable after the natural oxide layer 10 is removed because hydrogen termination for combining hydrogen with silicon atoms on the surface of the silicon substrate 9 is performed. Furthermore, the above natural oxide layer removing method does not roughen the inner surface of a silica tube use as the chamber 1. This is probably because fluorine radicals generally used as the etchant for an $SiO_2$ layer are not present.

For the sequence of introducing a gas into the chamber 1 and stopping supply of the gas, it is preferable to follow the above procedure.

That is, to remove the natural oxide layer 10 from the surface of the silicon substrate 9, hydrogen gas is introduced into the plasma generating part 4 and thereafter the plasma generating part 4 starts discharge and then $NF_3$ gas is introduced to the downstream side of the gas channel separate from the region in which the plasma generated by the part 4 is present, and thereafter water vapor is introduced into the plasma generating part 4. As the result of performing an experiment by first introducing water vapor before supplying hydrogen gas, it is found that the above advantage is not adequately shown.

After removal of the natural oxide layer 10 is completed, on the contrary, supply of water vapor is stopped and thereafter introduction of $NF_3$ gas is stopped and then discharge in the plasma generating part 4 is stopped and hydrogen gas is stopped. This is because, by stopping supply of water vapor before stopping supply of $NF_3$ gas and hydrogen gas, oxide layer is not deposited again due to water vapor on the surface of the silicon substrate 9 free from the natural oxide layer 10.

It is also possible to introduce oxygen into the plasma generating part 4 instead of water vapor. By introducing oxygen, hydrogen combines with the oxygen to generate $H_2O$ at the downstream side of the flow of a gas flown from the plasma generating part 4. Also in this case, it is necessary to introduce other gases into the chamber 1 before introducing oxygen and to stop supply of oxygen before stopping supply of other gases in order to prevent the surface of the silicon substrate 9 from oxidizing after hydrogen down-flow treatment. The same effect is obtained by introducing molecules made by combining one or more oxygen atoms instead of oxygen.

Moreover, gases having the same function as $NF_3$ include fluorine ($F_2$) and such fluorides as $SF_6$, $CHF_3$, $C_2F_6$, and $C_4F_8$. It is also possible to add an inactive gas such as nitrogen or argon to the fluorine or one of the fluorides.

(ii) Comparison embodiment with prior art

Figure 3A:
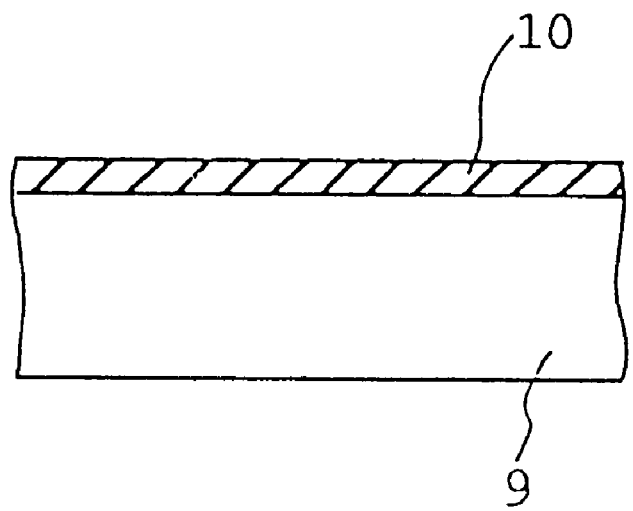
FIGS. 3A and 3B are sectional views showing a change of the surface of a silicon substrate treated by the prior art.
Figure 3B:
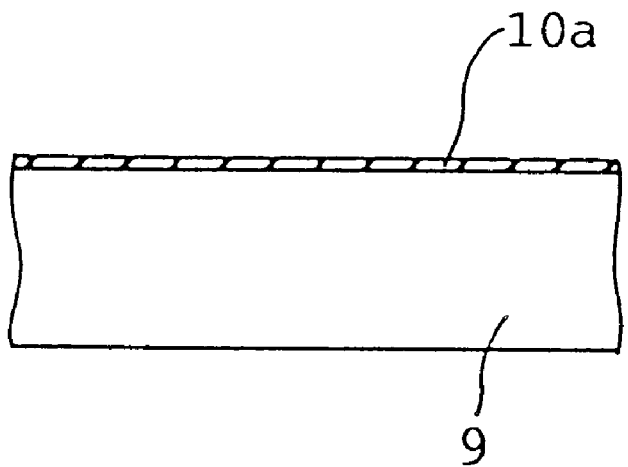

FIGS. 3A and 3B are sectional views of a substrate for explaining that a natural oxide layer is removed from the surface of a silicon substrate by the hydrogen plasma down-flow treatment of an existing embodiment.

The existing embodiment is different from an embodiment of the present invention in the fact that $NF_3$ gas is not added from the second gas introduction port 6 but the natural oxide layer 10 on the silicon substrate 9 shown in FIG. 3A is removed by only hydrogen radicals.

Treatment is performed in the same conditions and method as this embodiment except that $NF_3$ gas is not added.

In this case, an active gas containing a lot of hydrogen radicals flows at the downstream side of the gas flow. The hydrogen radicals directly reaches the wafer setting part 7 to react on the natural oxide layer 10. However, even after this state is kept for 60 min or more, the natural oxide layer 10 is not completely removed from the surface of the silicon substrate 9 as shown in FIG. 3B. Thereby, it is confirmed that the etching rate is small. As the result of introducing $NF_3$ into the plasma generating part 4 together with hydrogen, a natural oxide layer 10a is completely removed but it is found that the surface of the silica tube constituting the chamber 1 is etched at the same time.

(iii) Examination experiment

To examine the cause of the difference between the embodiment of the present invention and the prior art, the amount of hydrogen atoms in the wafer setting part 7 is examined and compared.

FIG. 4 shows a side view of a laboratory device. The laboratory device has the almost same constitution as that in FIG. 1 but it is different in that an ESR (electron spin resonance) measuring instrument 11 is set around the wafer setting part 7. The amount of hydrogen atoms in the wafer setting part 7 is measured by the measuring instrument 11. In FIG. 4, an object with the same symbol as in FIG. 1 represents the same object as in FIG. 1. Moreover, a gas is supplied to the chamber 1 in the same conditions and method as those described in the above embodiment of the present invention and the existing embodiment.

Figure 5A:
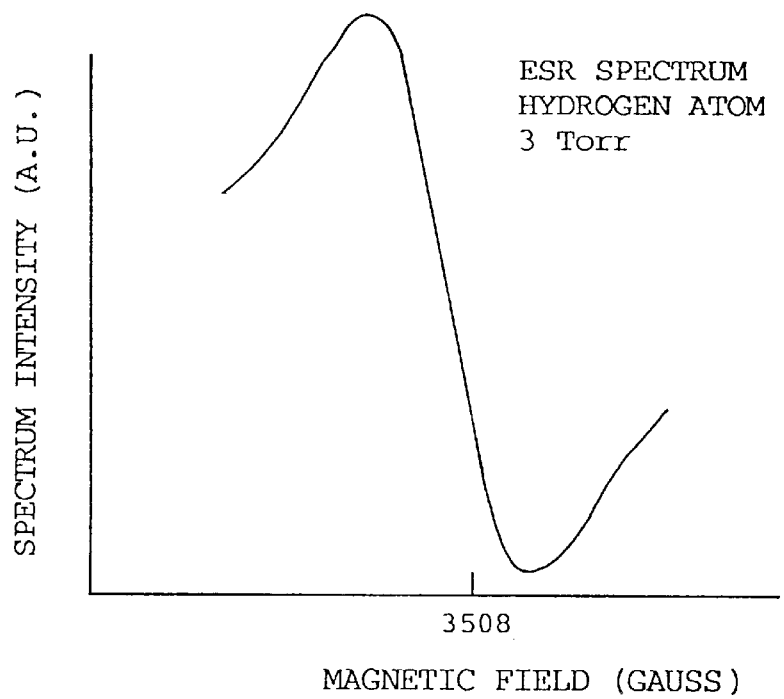
FIGS. 5A and 5B are ESR spectrum characteristic diagrams showing the results of experiments by the apparatus in FIG. 4.
Figure 5B:
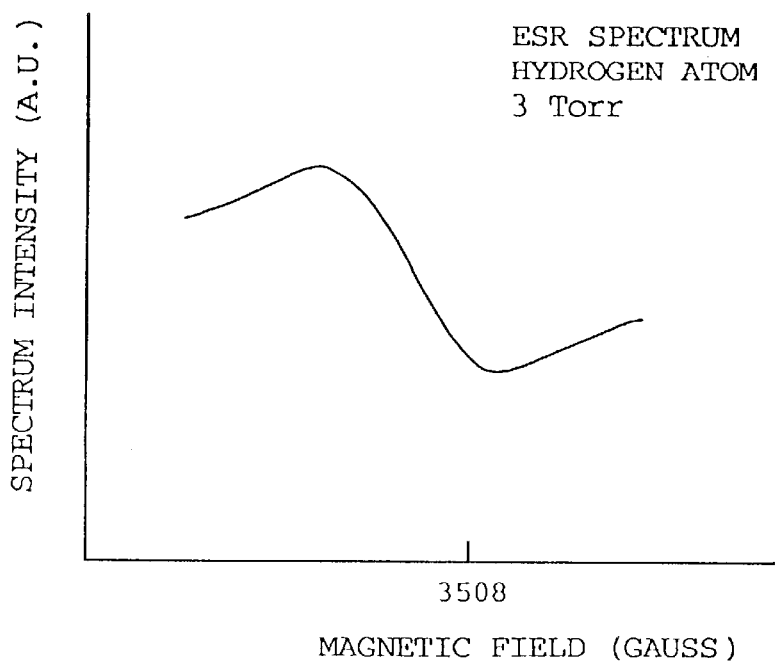

FIGS. 5A and 5B shows the experiment results.

FIG. 5A shows a case in which $NF_3$ gas is added like the above embodiment of the present invention and FIG. 5B shows a case in which no $NF_3$ gas is added. In FIGS. 5A and 5B, the axis of abscissas represents magnetic field intensity (Gauss) and the axis of ordinates represents arbitrary unit (A.U). The level difference between top and bottom peaks of a characteristic curve is approximately proportional to the amount of hydrogen atoms.

From FIGS. 5A and 5B, it is found that the embodiment of the present invention is larger than the prior art in the number of hydrogen atoms in the wafer setting part 7.

When generating hydrogen plasma without adding water vapor, most hydrogen atoms (hydrogen radicals) produced in the plasma are recombined on the inner surface of the silica tube and returned to hydrogen molecules at the down-flow side of the plasma. Therefore, the total number of hydrogen radicals suddenly decreases at the down-flow region of the plasma.

However, when adding water vapor to the hydrogen plasma, recombination of hydrogen atoms is suppressed by the water vapor. Thereby, hydrogen atoms are carried to the down-flow side without a decrease.

By adding $NF_3$ to high-concentration hydrogen radicals present at the down-flow side of the plasma region according to the function of water vapor, an etchant such as hydrofluoric acid (HF) is produced due to the reaction between hydrogen atoms and $NF_3$, and $SiO_2$ is etched by HF. Moreover, the concentration of hydrogen atoms at the down-flow side of the plasma must theoretically be decreased by adding $NF_3$ because hydrogen atoms are consumed in the case of the reaction for producing HF. However, contrary to the idea, it is found from FIGS. 5A and 5B that the number of hydrogen atoms increase at the down-flow side. This is probably because not only the reaction between hydrogen atoms and $NF_3$ causes HF but other reactions occur at the same time.

(3) Method of embodiment of the present invention for treating substrate after removing natural oxide layer Though the natural oxide layer 10 is removed by the hydrogen plasma down-flow treatment of the above embodiment in a short time without damaging the silicon substrate 9, a reaction product is sometimes present on the surface of the silicon substrate 9 even after removing a natural oxide layer. It is estimated that the reaction product is a compound of hydrogen, fluorine, etc. It is estimated that the compound is $(NH_4)_2SiF_6$.

The reaction product naturally disappears by leaving the product as it is for approx. 12 hr. However, while the product is left as it is, it is also considered that the surface of the silicon substrate 9 is oxidized again due to an interaction between the storage environment and the reaction product. Moreover, it is necessary to improve the throughput. Therefore, it is preferable to remove the reaction product in a short time.

To remove the reaction product, there are, for example, the following two methods (A) and (B).

(A) Method by heating

FIG. 6 is a sectional view of an apparatus for removing the reaction product from the surface of the silicon substrate 9. The apparatus is the same as the apparatus in FIG. 1 except that heating means 12 is provided at the inside or outer periphery of the wafer setting part 7 of the chamber 1. Therefore, the description of it is omitted. The heating means 12 uses a heater provided with an infrared lamp and high-resistance line or a method for heating by a wafer stage.

The following is the description of a method for removing a reaction product from the surface of the silicon substrate 9 treated by the method shown in the above Item (2)(i) by using the apparatus.

First, the natural oxide layer 10 is removed from the surface of the silicon substrate 9 by the method shown in the above Item (2)(i).

Thereafter, supply of water vapor is stopped and then introduction of $NF_3$ and discharge in the plasma generating part 4 are stopped in order, and hydrogen gas is continuously introduced into the chamber 1 at a flow rate of approx. 100 cc/min to keep the pressure in the chamber 1 at 1 Torr. Then, the temperature of the silicon substrate 9 is raised to approx. 60° C. or higher, preferably 100° C. by the heating means 12 to keep the state for approx. 3 min. When the heating means 12 uses an infrared lamp, the silicon substrate 9 can instantaneously heated up to 100° C. However, when it uses a high-resistance line heater, it requires approx. 30 sec to raise the heating temperature up to 100° C.

By using the above heating treatment, the deposit on the surface of the silicon substrate 9 disappears.

Figure 7A:
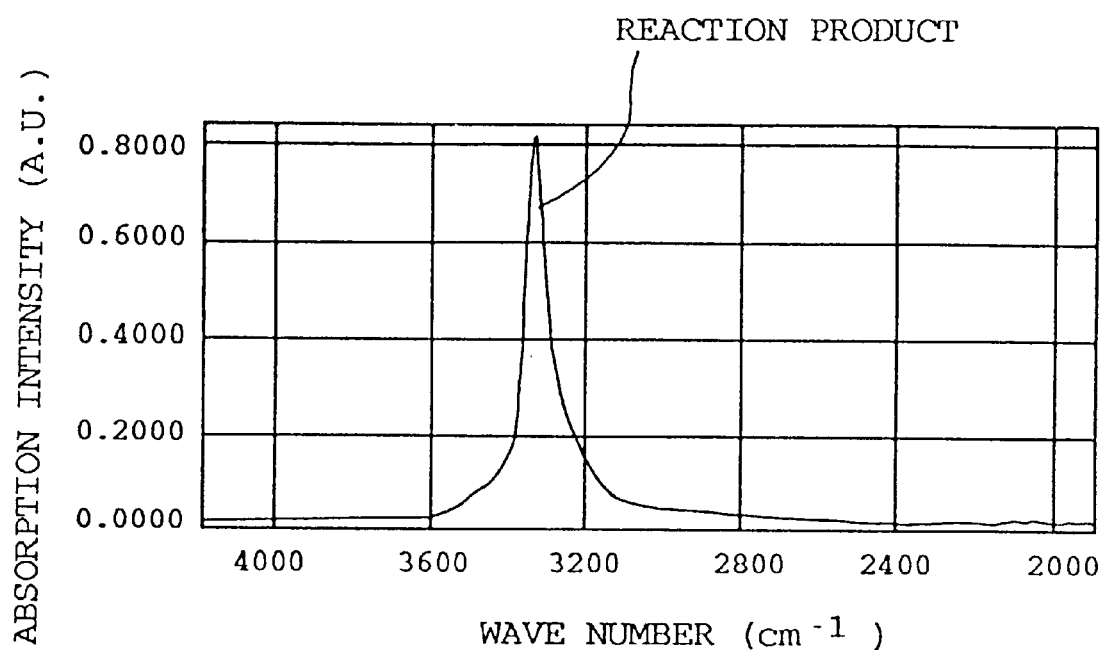
FIGS. 7A and 7B are FT-IR ATR characteristic diagrams for explaining generation and disappearance of the residue on the surface of a silicon substrate when the apparatus shown in FIG. 6 is used and the axis of abscissas of the diagrams shows wave number and the axis of ordinates shows absorption capacity.
Figure 7B:
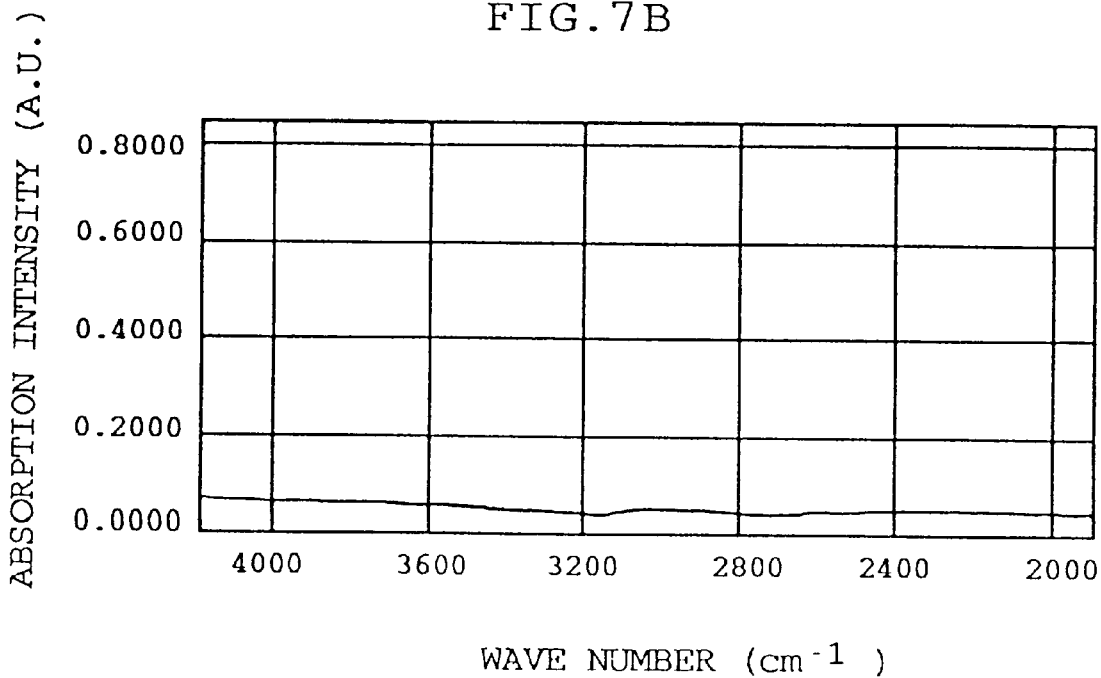

FIGS. 7A and 7B are characteristic diagrams showing the results of observing the presence of the reaction product on the surface of the silicon substrate 9 and the state of the silicon substrate 9 after thermally treated by the heating means 12. The axis of ordinates represents absorption quantity and the axis of abscissas represents wave number. Numerals added to the axis of ordinates do not represent the degree of absorption. (The same is true of FIGS. 8A and 8B.)

The surface state is analyzed by FT-IR ATR (Attenuated Total Reflection).

As shown in FIG. 7A, a peak of the infrared absorption capacity is present on the surface of the silicon substrate 9 before thermal treatment in the wave number range of 3,200 to 3,600 $cm^{-1}$ and the presence of a reaction product is observed. However, as the result of thermally treating the substrate at the temperature of 100° C. for approx. 3 min, it is found from FIG. 7B that the peak disappears and the reaction product is removed from the surface of the silicon substrate 9.

Thereby, because the reaction product is removed in a short time, the throughput after removing a natural oxide layer is improved and the substrate surface is not oxidized again.

Figure 8A:
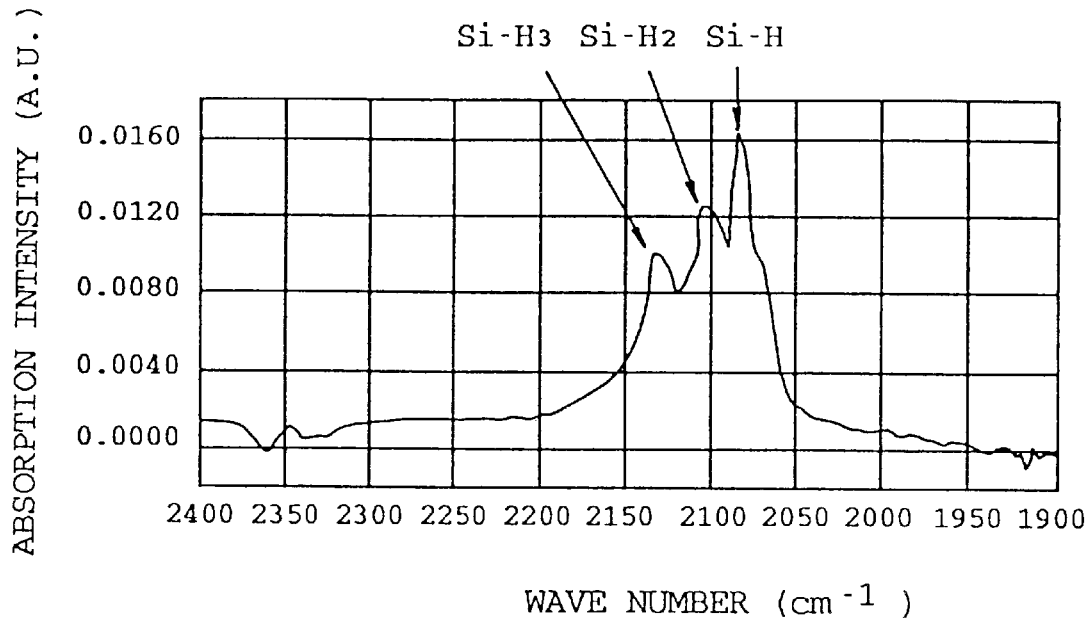
FIGS. 8A and 8B are FT-IR ATR characteristic diagrams obtained by enlarging some wave-number ranges in FIGS. 7A and 7B.

As the result of observing the surface of the hydrogen-plasma-down-flow-treated and then heated silicon substrate 9 by means of FT-IR, the analysis result shown in FIG. 8A is obtained.

From the characteristics of the wave number and infrared absorption capacity shown in FIG. 8A, it is found that there are three peaks in the infrared absorption capacity in the range of 2,050 to 2,150 $cm^{-1}$. The peaks show $SiH_3$, $SiH_2$, and SiH in order from the left side.

Thereby, it is clarified that silicon bond on the surface of the silicon substrate 9 after thermally treated combines with hydrogen. Moreover, from the analysis result, it is found that a peak of the infrared absorption capacity is not observed at the wave number around 2250 $cm^{-1}$ showing that oxygen combines with the silicon bond and no oxygen layer is present.

In the above description, hydrogen gas is introduced into the chamber 1 from the plasma generating part 4 to bring the silicon substrate 9 into a hydrogen atmosphere when thermal treatment is performed. However, a gas for covering the silicon substrate 9 is not restricted to hydrogen but nitrogen or argon gas with no oxidizing property can be used as long as it does not affect the surface of the silicon substrate 9. Moreover, it is possible to bring the inside of the chamber 1 into a high-vacuum state.

(B) Method by cleaning by water

A reaction product attached to the silicon substrate 9 can also be removed by cleaning the silicon substrate 9 by water. The details of the method are described below.

First, by using the method described in the above Item (2)(i), the natural oxide layer 10 is removed from the surface of the silicon substrate 9. Then, supply of a gas is stopped in order of water vapor and NF$_3$ and discharge by the plasma generating part 4 is stopped, and thereafter supply of hydrogen is stopped.

Figure 9:
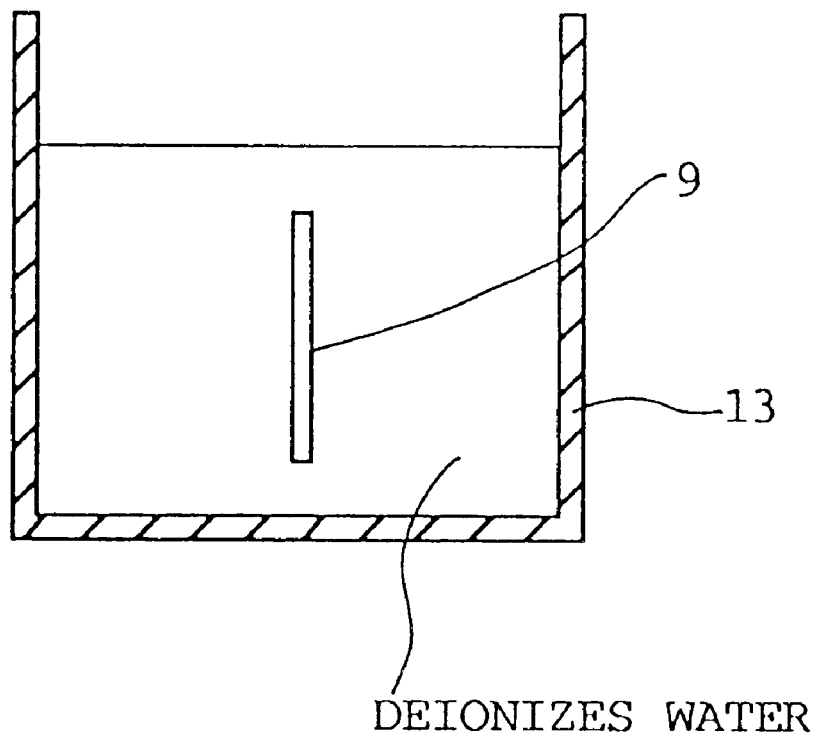
FIG. 9 is a sectional view of showing of a wet treatment apparatus to remove the residue on the surface of a silicon substrate.

Then, the silicon substrate 9 is taken out of the chamber 1 and within 30 min., as shown in FIG. 9, the silicon substrate 9 is cleaned by water for 5 min. or less, for example, for 2 min. in a water cleaning bath 13 filled with deionized water. The dissolved-oxygen quantity of the deionized water is 80 ppb or less. Thereby, a danger in which the surface of the silicon substrate 9 is oxidized is greatly decreased.

Because the oxidation rate decreases as the dissolved-oxygen quantity of the deionized water decreases, it is preferable to decrease the dissolved-oxygen quantity when cleaning the silicon substrate 9 by water. In general, the dissolved-oxygen quantity of deionized water not provided with dissolved-oxygen decreasing treatment is approx. 1 ppm. A value requested for the dissolved-oxygen quantity of deionized water is 50 to 100 ppb for a 1M-bit DRAM (dynamic random access memory) and 20 to 50 ppb for a 4M-bit DRAM.

As the result of observing the surface of the water-cleaned silicon substrate 9 by means of FT-IR ATR, it is found that the reaction product shown by a peak before water cleaning disappears.

By cleaning the silicon substrate 9 by deionized water containing less dissolve-oxygen quantity for approx. 2 min., a reaction product is removed. Therefore, the time until transferring the silicon substrate 9 to the next step is shortened, the throughput is improved, and a danger of re-oxidation is eliminated.

Figure 8B:
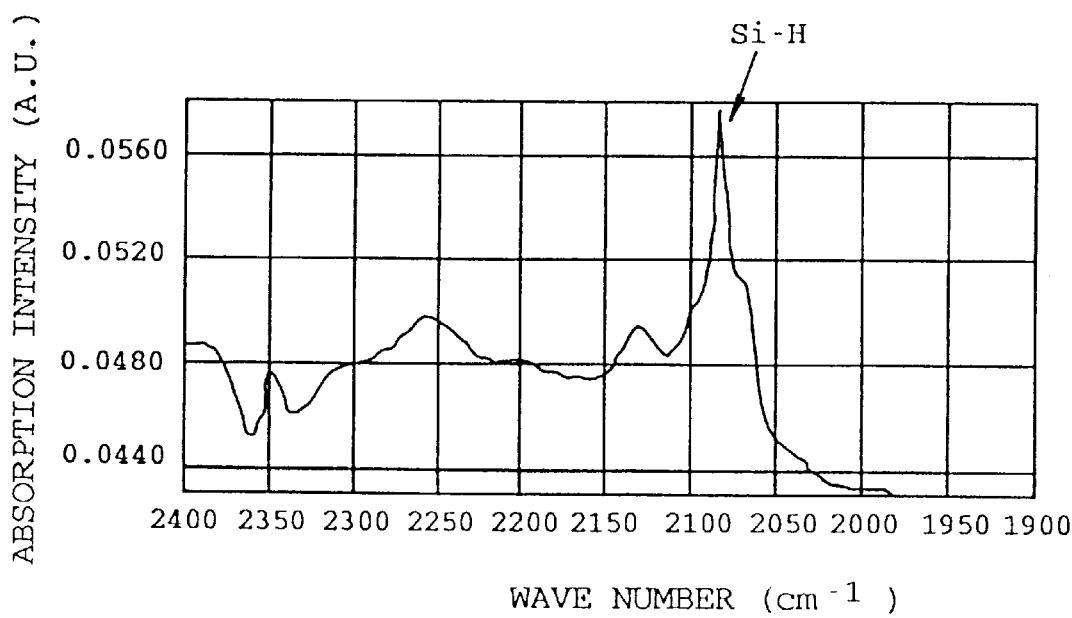

As the result of observing the surfaces of a plurality of hydrogen-plasma-down-flow-treated silicon substrates 9 after cleaned by water through FT-IR ATR, the analysis result shown in FIG. 8B is obtained.

From the characteristics of wave number and infrared absorption capacity shown in FIG. 8B, it is found that there is a peak showing SiH in the infrared absorption capacity in the range of 2,050 to 2,100 cm$^{-1}$.

Thereby, it is clarified that silicon atoms on the surface of the silicon substrate 9 after heated combine with hydrogen. From the characteristic diagram, it is found that a peak of the infrared absorption capacity at the wave number around 2,250 cm$^{-1}$ is hardly observed and an oxide layer is hardly present.

(4) Summary

As described above, the present invention removes a natural oxide layer by adding a gas containing nitrogen fluoride (NF$_3$) to plasma down-flow of a mixed gas of hydrogen and water vapor (H$_2$+H$_2$O) or hydrogen and oxygen (H$_2$+O$_2$) and exposing the mixed gas to a natural oxide layer on a semiconductor layer such as silicon. Thereby, it is confirmed by an experiment that, for example, the treatment time for removing the natural oxide layer from the surface of the silicon substrate is shortened.

Moreover, the present invention treats an object to be treated by adding NF$_3$-contained gas to an active gas in a region at the downstream side of the flow of a gas flown from a plasma generating region and free from a gas under plasma state. Thereby, no high-energy particle is contained in a reaction gas or a substrate is not damaged. Moreover, because no atomic fluorine is present, the inner surface of a silica tube constituting a reaction chamber is not etched.

Furthermore, because the present invention performs dry treatment using hydrogen gas, fluorine is prevented from remaining on the semiconductor layer differently from wet treatment and hydrogen termination is performed. Thereby, a surface to be treated becomes chemically stable after it is treated. Furthermore, the apparatus of the present invention can easily be connected with many other fabrication apparatuses including a CVD apparatus and sputtering apparatus. Therefore, a series of steps can easily be automated.

Furthermore, because supply of water vapor and oxygen is first stopped after a natural oxide layer is removed by using a mixed gas of hydrogen and water vapor or a mixed gas of oxygen and hydrogen, and NF$_3$, no oxidizing gas is present on the surface of a silicon substrate immediately before taken out. Thus, it is possible to prevent the surface of a hydrogen-plasma-down-flow-treated substrate from oxidizing again.

If a reaction product is deposited on the surface of a substrate after removing a natural oxide layer, it can be removed by heating the substrate or cleaning it by deionized water with a small dissolved-oxygen quantity. Thereby, it is possible to clean the surface of the substrate and improve the throughput.

By using the above treatment, it is possible to remove a natural oxide layer on the surface of a amorphous silicon, polycrystalline silicon or other semiconductor layer, and to hydrogen-terminate the surface.

What is claimed is:

1. A method for fabricating semiconductor devices, comprising the steps of:

transforming at least hydrogen and oxygen in a gas flow containing hydrogen gas and one of oxygen gas and oxygen-atom-containing molecular gas, into plasma to generate an active gas which contains hydrogen radicals and water vapor;

adding at least a fluorine-containing gas to the active gas flow to develop a flow of mixed gas; and exposing a surface of a semiconductor wafer to the flow of mixed gas at a region downstream from the region in which the fluorine-containing, gas is added, for removing an oxide from the surface of the semiconductor wafer and hydrogen-terminating the surface.

2. The method of fabricating semiconductor devices according to claim 1, wherein the fluorine-containing gas is selected from the group consisting of F$_2$, NF$_3$, CF$_4$, SF$_6$, CHF$_3$, C$_2$F$_6$ and C$_4$F$_8$.

3. The method for fabricating semiconductor devices according to claim 1, wherein the oxygen-atom-containing molecular gas is water vapor.

4. The method for fabricating semiconductor devices according to claim 1, wherein the semiconductor wafer is (a) made of silicon and covered with a natural oxide layer.

5. The method for fabricating semiconductor devices according to claim 1, further comprising the step of heating the hydrogen-terminated surface of the semiconductor wafer to the temperature of 60° C. or higher.

6. The method for fabricating semiconductor devices according to claim 5, wherein the heating is performed by setting the semiconductor wafer in an atmosphere containing no oxidizing gas.

7. The method for fabricating semiconductor devices according to claim 1, further comprising the step of cleaning the hydrogen-terminated surface of the semiconductor layer with water.

8. The method for fabricating semiconductor devices according to claim 7, wherein deionized water with a dissolved-oxygen quantity of 80 ppb or less is used to clean the hydrogen-terminated surface of the semiconductor wafer.

9. A method for fabricating semiconductor devices, comprising the steps of:

starting a flow of hydrogen gas through a first region of a fabrication apparatus;

transforming the hydrogen gas into plasma in the first region while the hydrogen gas is flowing downstream;

adding at least a fluorine-containing gas to a second region of the fabrication apparatus, the second region being downstream from the first region;

starting a flow of at least one of oxygen gas and an oxygen-atom-containing molecular gas through the first region to transform the gas into plasma, while the fluorine-containing gas is flowing, the hydrogen gas, fluorine-containing gas and the oxygen gas or oxygen-atom-containing molecular gas forming a mixed gas flow at the second region;

exposing a surface of a semiconductor wafer to the mixed gas flow to remove an oxide from the surface of the semiconductor layer;

stopping introduction of the oxygen gas or the oxygen-atom-containing molecular gas introduced into the first region after removing the oxide;

stopping introduction of the fluorine-containing gas after stopping introduction of the oxygen gas or the oxygen-atom-containing-molecular gas;

stopping transformation of the gas present in the first region into plasma; and stopping introduction of the hydrogen gas after stopping transformation of the gas present in the first region into plasma.

10. The method for fabricating semiconductor devices according to claim 9, wherein the fluorine-containing gas is one of $F_2$, $NF_3$, $CF_4$, $SF_6$, $CHF_3$, $C_2F_6$ and $C_4F_8$.

11. A method for removing an oxide film from a semiconductor surface, comprising the steps of:

generating hydrogen radicals by transforming a hydrogen gas into plasma;

adding water vapor to the hydrogen radicals in order to suppress recombination of the hydrogen radicals;

adding a fluorine-containing gas to a mixed gas of said hydrogen radicals and said water vapor outside an area where hydrogen radicals are generated; and exposing the semiconductor surface to the mixed gas including the fluorine-containing gas in order to remove the oxide film formed thereon.

12. The method according to claim 11, wherein the fluorine-containing gas is selected from the group consisting of $F_2$, $NF_3$, $CF_4$, $SF_6$, $CHF_3$, $C_2F_6$ and $C_4F_8$.

13. The method according to claim 11, wherein said semiconductor surface is exposed to the mixed gas including the fluorine-containing gas at a place which is apart from where said fluorine-containing gas is added to the mixed gas so that the hydrogen radicals react with the fluorine-containing gas before reaching the semiconductor surface.

* * * * *

UNITED STATES PATENT AND TRADEMARK OFFICE
CERTIFICATE OF CORRECTION

PATENT NO.  : 5,919,336
DATED       : July 6, 1999
INVENTOR(S) : Jun KIKUCHI, et al.

It is certified that error appears in the above-identified patent and that said Letters Patent is hereby corrected as shown below:

Col. 10, line 47, delete "(a)".

Signed and Sealed this

Twenty-fifth Day of January, 2000

Attest:

Attesting Officer

*Acting Commissioner of Patents and Trademarks*